(12) United States Patent
Roy et al.

(10) Patent No.: US 11,393,532 B2
(45) Date of Patent: *Jul. 19, 2022

(54) CIRCUIT AND METHOD FOR AT SPEED DETECTION OF A WORD LINE FAULT CONDITION IN A MEMORY CIRCUIT

(71) Applicant: STMicroelectronics International N.V., Geneva (CH)

(72) Inventors: Tanmoy Roy, Greater Noida (IN); Tanuj Kumar, Noida (IN); Shishir Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,938

(22) Filed: Apr. 13, 2020

(65) Prior Publication Data

US 2020/0342940 A1 Oct. 29, 2020

Related U.S. Application Data

(60) Provisional application No. 62/837,905, filed on Apr. 24, 2019.

(51) Int. Cl.
*G11C 16/08* (2006.01)
*G11C 16/24* (2006.01)
(Continued)

(52) U.S. Cl.
CPC .......... *G11C 16/08* (2013.01); *G11C 16/0433* (2013.01); *G11C 16/24* (2013.01);
(Continued)

(58) Field of Classification Search
CPC ......... G11C 16/08; G11C 16/24; G11C 29/44; G11C 16/0433; G11C 2029/1204; G11C 2029/1202; G11C 29/025
See application file for complete search history.

(56) References Cited

U.S. PATENT DOCUMENTS 5,615,163 A 3/1997 Sakui et al.
5,748,545 A 5/1998 Lee et al.
(Continued)

OTHER PUBLICATIONS

Badodekar, Nilesh: "Mitigating Single-Event Upsets Using Cypress's 65-nm Asynchronous SRAM," AN88889, Cypress Doc. No. 001-88889 Rev. *C, www.cypress.com, 2014 (14 pages).
(Continued)

*Primary Examiner* — Vu A Le
(74) *Attorney, Agent, or Firm* — Crowe & Dunlevy

(57) ABSTRACT

First and second memory arrays have common word lines driven by a row decoder in response to a row address. A first word line encoder associated with the first memory array encodes signals on the word lines to generate a first encoded value, and a second word line encoder associated with the second memory array encodes signals on the word lines to generate a second encoded value. Comparison circuitry compares the first encoded value to a first expected value (e.g., a first portion of the row address) and compares the second encoded value to a second expected value (e.g., a second portion of the row address). An error flag is asserted to indicate presence of a word line fault based upon a lack of match between the first encoded value and the first expected value and/or a lack of match between the second encoded value and the second expected value.

25 Claims, 12 Drawing Sheets

(51) Int. Cl.
  *G11C 16/04*  (2006.01)
  *G11C 29/44*  (2006.01)
  *G11C 29/12*  (2006.01)

(52) U.S. Cl.
  CPC ...... *G11C 29/44* (2013.01); *G11C 2029/1202* (2013.01); *G11C 2029/1204* (2013.01)

(56) References Cited

U.S. PATENT DOCUMENTS

| | | |
|---|---|---|
| 5,774,471 A | 6/1998 | Jiang |
| 5,835,419 A | 11/1998 | Ichimura et al. |
| 6,865,133 B2 | 3/2005 | Tsukidate et al. |
| 6,876,557 B2 | 4/2005 | Hsu et al. |
| 7,170,804 B2 | 1/2007 | Rehm |
| 7,287,148 B2 | 10/2007 | Kanapathippillai et al. |
| 7,567,464 B2 * | 7/2009 | Gendrier ............. G06F 11/1008 365/185.09 |
| 7,582,921 B2 | 9/2009 | Sekiguchi et al. |
| 7,603,592 B2 | 10/2009 | Sekiguchi et al. |
| 7,697,357 B2 | 4/2010 | Tomishima |
| 7,904,790 B2 | 3/2011 | Lee et al. |
| 8,189,423 B2 | 5/2012 | Keeth et al. |
| 9,268,637 B2 | 2/2016 | Gifford et al. |
| 9,519,442 B2 | 12/2016 | Mnich et al. |
| 9,685,484 B1 | 6/2017 | Rabkin et al. |
| 9,911,510 B1 | 3/2018 | Kwon et al. |
| 9,953,994 B2 | 4/2018 | Or-Bach et al. |
| 9,965,352 B2 | 5/2018 | Suh et al. |
| 10,692,548 B2 * | 6/2020 | Tran ........................ G11C 8/12 |
| 2003/0151437 A1 | 8/2003 | Demone |
| 2004/0022092 A1 | 2/2004 | Kvir et al. |
| 2012/0008384 A1 | 1/2012 | Li et al. |
| 2012/0281479 A1 | 11/2012 | Kochar et al. |
| 2015/0194201 A1 | 7/2015 | Kim et al. |
| 2015/0243368 A1 | 8/2015 | Remington |
| 2018/0277174 A1 * | 9/2018 | Tran ........................ G11C 8/12 |
| 2020/0194093 A1 * | 6/2020 | Chen ...................... G11C 29/74 |
| 2020/0243153 A1 * | 7/2020 | Kumar ................. G11C 29/024 |

OTHER PUBLICATIONS

Ehlig, Peter and Pezzino, Salvatore: "Error Detection in SRAM," Texas Instruments Application Report SPRACCO—Nov. 2017, 14 pages.

* cited by examiner

CIRCUIT AND METHOD FOR AT SPEED DETECTION OF A WORD LINE FAULT CONDITION IN A MEMORY CIRCUIT

RELATED APPLICATION

This application claims priority to U.S. Provisional Patent Application No. 62/837,905, filed on Apr. 24, 2019, the contents of which are incorporated by reference in their entirety to the maximum extent allowable under the law.

TECHNICAL FIELD

This disclosure generally relates to testing circuits for detecting faults resulting from open metal lines in memory circuits (e.g., faults in word lines, column selection lines, bitline precharge lines, etc.).

BACKGROUND

Reference is now made to FIG. 1 which shows a simplified block diagram of a memory circuit 10. The circuit 10 includes an array 12 of memory cells C arranged in rows and columns. The memory cells in each row are controlled by a word line from among word lines 14a ... 14n. The memory cells in each column are connected to a bit line from among bit lines 16a ... 16n. A row decoder circuit 18 receives a row address that is predecoded from an address 20 and decodes the bits of the row address to select and actuate one of the word lines 14a ... 14n. A column decoder circuit 22 receives a column address that is predecoded from the address 20 and decodes the bits of the column address to select a plurality of the bit lines 16a ... 16n. In write mode, data on the data input/output lines 24 is written to the memory cells which are located at the intersections of the selected one of the word lines 14a ... 14n and the plurality of bit lines 16a ... 16n selected by the address 20. In read mode, data stored in the memory cells which are located at the intersections of the selected one of the word lines 14a ... 14n and the plurality of bit lines 16a ... 16n selected by the address 20 is read out to the data input/output lines 24.

A successful read or write operation is contingent on application of the actuation voltage (typically a logic high voltage Vdd) by the word line driver circuit at the selected one of the word lines 14a ... 14n to each memory cell C in the selected row.

Reference is now made to FIG. 2 which shows a simplified block diagram of another memory circuit 10' in which there are two arrays 12a, 12b of memory cells C arranged into rows and columns. The memory cells in each row are controlled by a word line from among word lines 14a ... 14n. The memory cells in each column of array 12a are connected to a bit line from among bit lines 16aa ... 16an. The memory cells in each column of array 12b are connected to a bit line from among bit lines 16ba ... 16bn.

A control circuit 110 receives an address 20 of the memory location to be accessed in read/write and, in response to the clock signal Clk indicating start of a memory access operation (read/write), performs an address predecoding operation to generate the row address RAddr that is applied to the row decoder 18' and the column address CAddr that is applied to the column decoders 22a, 22b. The row decoder circuit 18' receives row address Raddr and decodes the bits of the row address to select and actuate one of the word lines 14a ... 14n. The column decoder circuits 22a, 22b receive the column address CAddr and decode the bits of the column address to select a plurality of the bit lines 16aa ... 16an, 16ba ... 16bn. In write mode, data on the data input/output lines 24a, 24b is written to the memory cells which are located at the intersections of the selected one of the word lines 14a ... 14n and the plurality of bit lines 16aa ... 16an, 16ba ... 16bn selected by the address 20. In read mode, data stored in the memory cells which are located at the intersections of the selected one of the word lines 14a ... 14n and the plurality of bit lines 16aa ... 16an, 16ba ... 16bn selected by the address 20 is read out to the data input/output lines 24a, 24b.

It is recognized, however, that faults in read or write modes may occur. Three fault cases of concern are: a) no word line is selected; b) multiple word lines are simultaneously selected; and c) the incorrect word line for the address 20 is selected.

While fault detection techniques based upon evaluating data read out from the input/output lines 24 or 24a, 24b are known, no such fault detection technique is known that can detect the above three fault cases in a high percentage of situations. Therefore, further development in fault detection techniques and circuitry supporting such fault detection techniques is necessary.

It should be noted that the above three fault cases are not limited to word lines, and indeed may occur with any metal lines in memory circuits with two or more memory arrays. For example, a no line selected fault, a multiple line selected fault, and an incorrect line selected fault may occur in any metal lines (e.g., column selection lines, bitline precharge lines, etc.). Further development into fault detection techniques and circuitry supporting fault detection techniques that can detect these three fault cases for any metal lines is therefore needed.

SUMMARY

Disclosed herein is a circuit including a first memory array, a second memory array, $2^N$ lines common to the first memory array and the second memory array, and a circuit configured to selectively drive the $2^N$ lines in response to an N-bit address. A first fault detection circuit is associated with the first memory array, the first fault detection circuit being configured to encode signals on the $2^N$ lines to generate a first encoded value. A second fault detection circuit is associated with the second memory array, the second fault detection circuit being configured to encode signals on the $2^N$ lines to generate a second encoded value. Comparison circuitry is configured to compare the first encoded value to a first expected value corresponding to odd bits of the N-bit address and to compare the second encoded value to a second expected value corresponding to even bits of the N-bit address.

The first fault detection circuit may include N/2 bit lines, N/2 complementary bit lines for the N/2 bit lines, one transistor per bit line, and one transistor per complementary bit line.

The second fault detection circuit may include N/2 bit lines, N/2 complementary bit lines for the N/2 bit lines, one transistor per bit line, and one transistor per complementary bit line.

The N/2 bit lines of the first fault detection circuit may correspond to odd bits of the address and the N/2 bit lines of the second fault detection circuit may correspond to even bits of the address.

The first fault detection circuit may have its transistors connected to its N/2 bit lines and N/2 complementary bit lines in a first configuration pattern in which each transistor of the first fault detection circuit is connected to couple one of the N/2 bit lines of the first fault detection circuit or one of the N/2 complementary bit lines of the first fault detection circuit to ground in response to assertion of an associated one of the plurality of lines. In addition, the second fault detection circuit may have its transistors connected to its N/2 bit lines and N/2 complementary bit lines in a second configuration pattern in which each transistor of the second fault detection circuit is connected to couple one of the N/2 bit lines of the second fault detection circuit or one of the N/2 complementary bit lines of the second fault detection circuit to ground in response to assertion of an associated one of the plurality of lines. The second configuration pattern is different than the first configuration pattern.

Also disclosed herein is a circuit including memory arrays, word lines common to the memory arrays, a row decoder configured to drive the word lines in response to a row address, and word line fault detection circuits associated with the memory arrays. The word line fault detection circuits are configured to encode signals on the word lines to generate encoded values. Comparison circuitry is configured to detect presence of a word line fault based upon the encoded values.

The comparison circuitry may detect the presence of the word line fault based upon comparing the encoded values to expected values.

The row decoder may be located between two adjacent ones of the memory arrays.

The word line fault detection circuits may be located adjacent to the two adjacent ones of the memory arrays on sides thereof opposite to the row decoder.

The comparison circuitry may include comparison circuits configured to compare the encoded values to expected values corresponding to portions of the row address, and asserts error flags based upon lack of matches between the encoded values and the expected values.

The word line fault detection circuits may collectively define a word line encoder configured to generate a total encoded value from signals on the word lines, the total encoded value including the each of the encoded values.

A method aspect is disclosed herein and includes selectively driving a plurality of word lines common to first and second memory arrays, in response to receipt of a row address, encoding signals on the plurality of word lines to generate a first encoded value, using a first word line fault detection circuit, encoding signals on the plurality of word lines to generate a second encoded value, using a second word line fault detection circuit, comparing the first encoded value to a first expected value corresponding to a first portion of the row address and comparing the second encoded value to a second expected value corresponding to a second portion of the row address, and asserting at least one error flag indicating presence of a word line fault based upon a lack of match between the first encoded value and the first expected value and/or a lack of match between the second encoded value and the second expected value.

Comparing the first encoded value to the first expected value corresponding to the first portion of the row address and comparing the second encoded value to the second expected value corresponding to a second portion of the row address may be performed by comparing the first encoded value to the first expected value corresponding to the first portion of the row address and asserting a first error flag indicating presence of a word line fault with the first memory array based upon a lack of match between the first encoded value and the first expected value, using a first comparison circuit, comparing the second encoded value to the second expected value corresponding to the second portion of the row address and to assert a second error flag indicating presence of a word line fault with the second memory array based upon a lack of match between the second encoded value and the second expected value, using a second comparison circuit.

The method may also include generating a total encoded value from signals on the plurality of word lines, the total encoded value including the first encoded value and the second encoded value, using a word line encoder collectively defined by the first word line fault detection circuit and the second word line fault detection circuit.

BRIEF DESCRIPTION OF THE DRAWINGS

For a better understanding of the embodiments, reference will now be made by way of example only to the accompanying figures in which.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
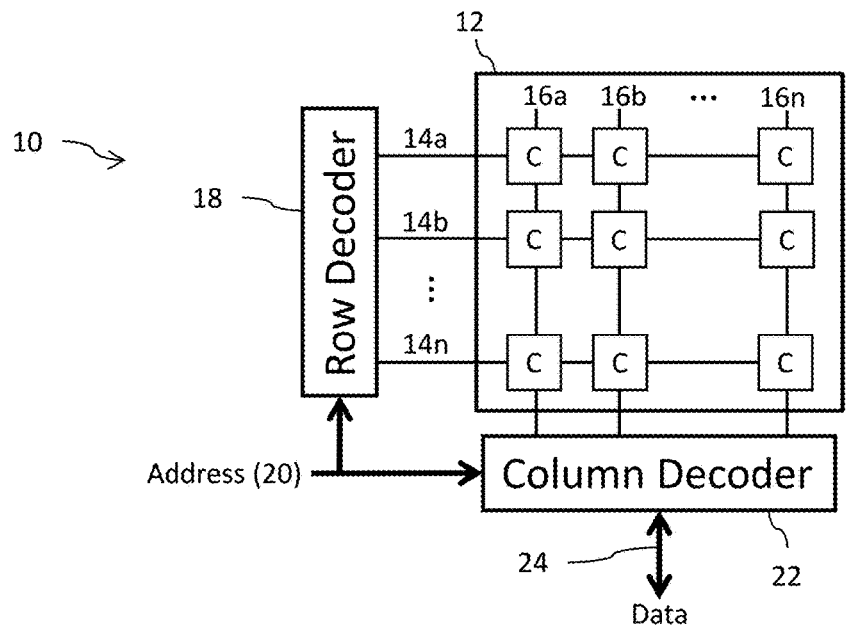
FIG. 1 is a simplified block diagram of a first known memory circuit of a single side array memory.
Figure 2:
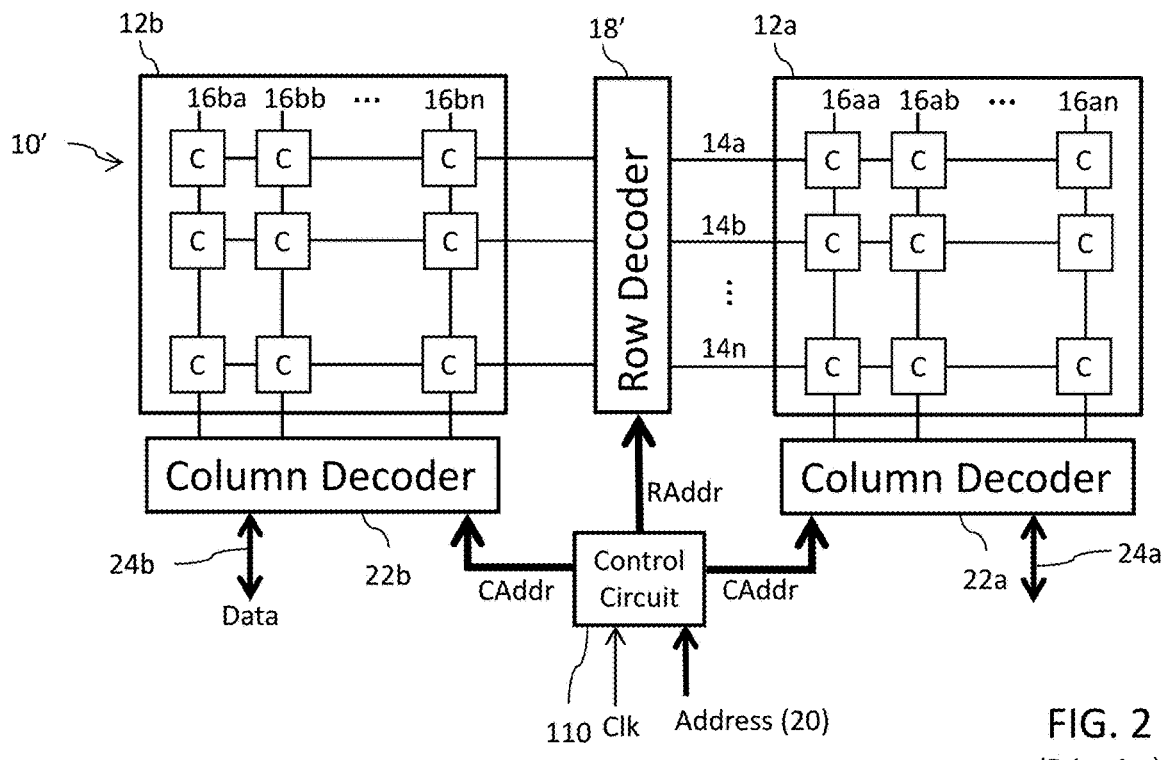
FIG. 2 is a simplified block diagram of a second known memory circuit of a butterfly type memory (array on both side of control circuitry)
Figure 3:
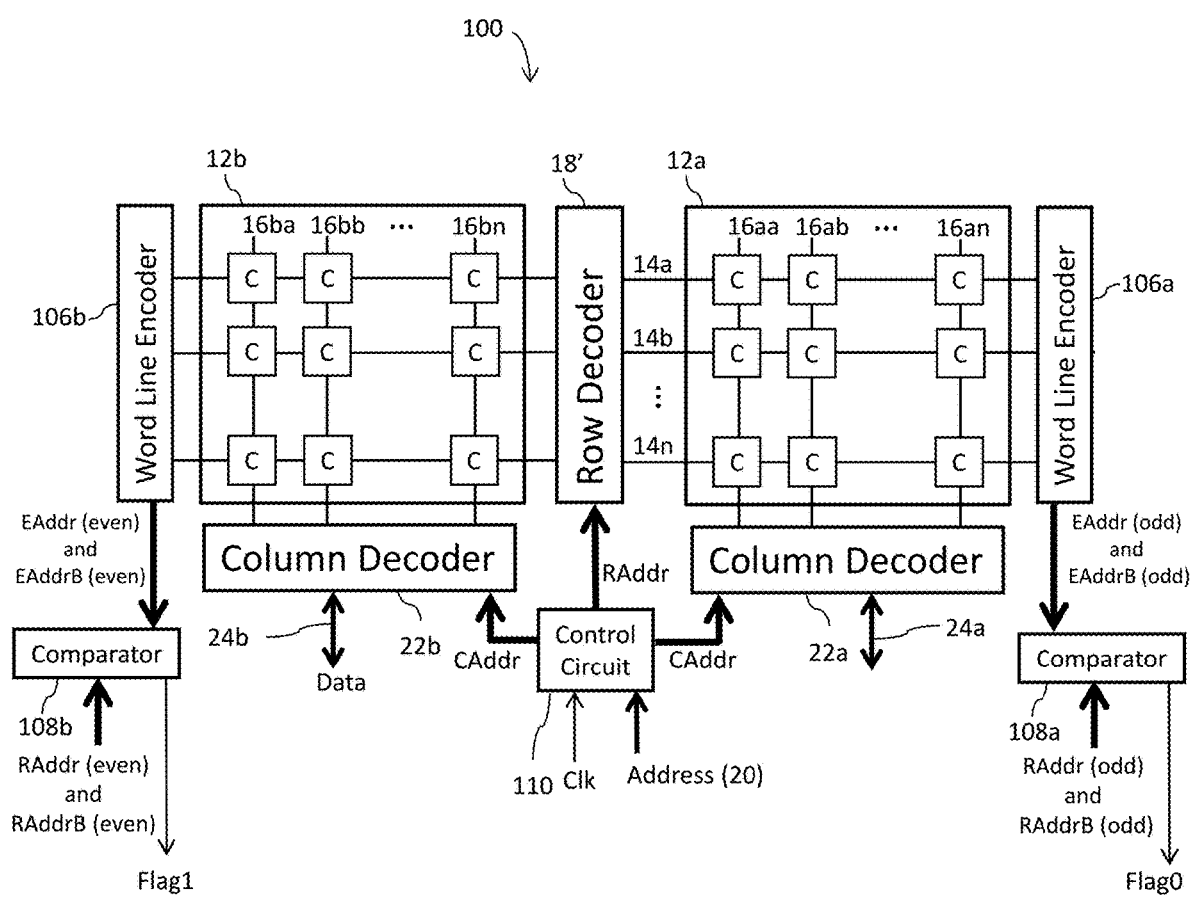
FIG. 3 is a block diagram of a butterfly type memory circuit with a word line error detection circuit for each side.

Reference is now made to FIG. 3 which shows block diagram of a memory circuit 100 that has the capability of detecting a high percentage of no word line, multiple word line, and incorrect word line errors should they occur during operation.

The circuit 100 includes first and second arrays 12a, 12b of memory cells arranged in rows and columns. The memory cells in each row are controlled by a word line from among word lines 14a . . . 14n. The memory cells in each column are connected to a bit line from among bit lines 16aa . . . 16an (for array 12a) and 16ba . . . 16bn (for array 12bn).

The control circuit 110 receives an address 20 of the memory location to be accessed in read/write and, in response to the clock signal Clk indicating start of a memory access operation (read/write), performs an address predecoding operation to generate the row address RAddr that is applied to the row decoder 18' and the column address CAddr that is applied to the column decoders 22. The row decoder circuit 18' receives row address RAddr and decodes the bits of the row address to select and actuate one of the word lines 14a . . . 14n. The column decoder circuits 22a, 22b receive the column address CAddr and decode the bits of the column address to select a plurality of the bit lines 16aa . . . 16an, 16ba . . . 16bn. In write mode, data on the data input/output lines 24a, 24b is written to the memory cells which are located at the intersections of the selected one of the word lines 14a . . . 14n and the plurality of bit lines 16aa . . . 16an, 16ba . . . 16bn selected by the address 20. In read mode, data stored in the memory cells which are located at the intersections of the selected one of the word lines 14a . . . 14n and the plurality of bit lines 16aa . . . 16an, 16ba . . . 16bn selected by the address 20 is read out to the data input/output lines 24a, 24b.

The circuit 100 includes word line encoder circuits 106a, 106b that cooperate with comparators 108a, 108b to detect word line faults. The word line encoder circuits 106a, 106n are connected to each of the word lines 14a . . . 14n and operate to encode the signals on the word lines 14a . . . 14n to collectively generate an encoded address EAddr and its complement EAddrB for output. The encoded address EAddr, if an error is not present, will be the same as the row address RAddr, and complement encoded address EaddrB, if an error is not present, will be the same as the complement of the row address RAaddr. Comparators 108a, 108b collectively serve to compare the encoded address EAddr and its complement EAddrB to the row address RAddr and its complement RAddrB and assert respective output flags Flag0, Flag1 based upon detected matches, meaning that Flag0 and/or Flag1 will be deasserted in the presence of a word line error.

In particular, the word line encoder 106a encodes the signals on its associated encoder bitlines to thereby generate the odd bits of the encoded address, which will be denoted as EAddr(odd), as well as the complements of the odd bits of the encoded address, which will be denoted as EAddrB (odd). Likewise, word line encoder 106b encodes the signals on its associated encoder bitlines to thereby generate the even bits of the encoded address, which will be denoted as EAddr(even), as well as the complements of the even bits of the encoded address, which will be denoted as EAddrB (even).

In particular, the comparator 108a receives the odd bits of the row address RAddr(odd) and complementary row address RAddrB(odd), and the comparator 108b receives the even bits of the row address RAddr(even) and complementary row address RAddrB(even). The comparator 108a compares the odd bits of the encoded address EAddr(odd) to the odd bits of the row address RAddr(odd) and compares the odd bits of the complement encoded address EAddrB(odd) to the odd bits of the complement row address RAddrB (odd), and then asserts Flag® if both EAddr(odd)=RAddr (odd) and EAddrB(odd)=RAddrB(odd). The comparator 108b compares the even bits of the encoded address EAddr (even) to the even bits of the row address RAddr(even) and compares the even bits of the complement encoded address EAddrB(even) to the even bits of the complement row address RAddrB(even), then asserts Flag1 if both EAddr (even)=RAddr(even) and EAddrB(even)=RAddrB(even).

By evaluating the individual flags Flag® and Flag1 and/or the combination of Flag® and Flag1, fault cases can be detected. Indeed, the comparator circuits 108a, 108b collectively can detect the three different fault cases as follows: a) no word line selected, b) incorrect word line selected, and c) multiple word lines simultaneously selected.

The purpose of splitting the word line encoding between two encoders 106a, 106b is so that errors on both sides of memory arrays 12a, 12b can be detected. If there were one encoder, word line errors with only one of the memory arrays 12a, 12b could be detected.

Note that FIG. 3 applies to any size memory array, and thus any size address, column address, row address, and encoded address may be present.

In order to allow for ease of explanation and illustration, simplified examples will now be given that assume that the row address is a two bit address, and that there are therefore four word lines 14a-14d. The structure for real world implementations where the address itself is, for example, 64 bits, will be evident to those of skill in the art upon review of these examples, as will the operation of the circuits.

Figure 4:
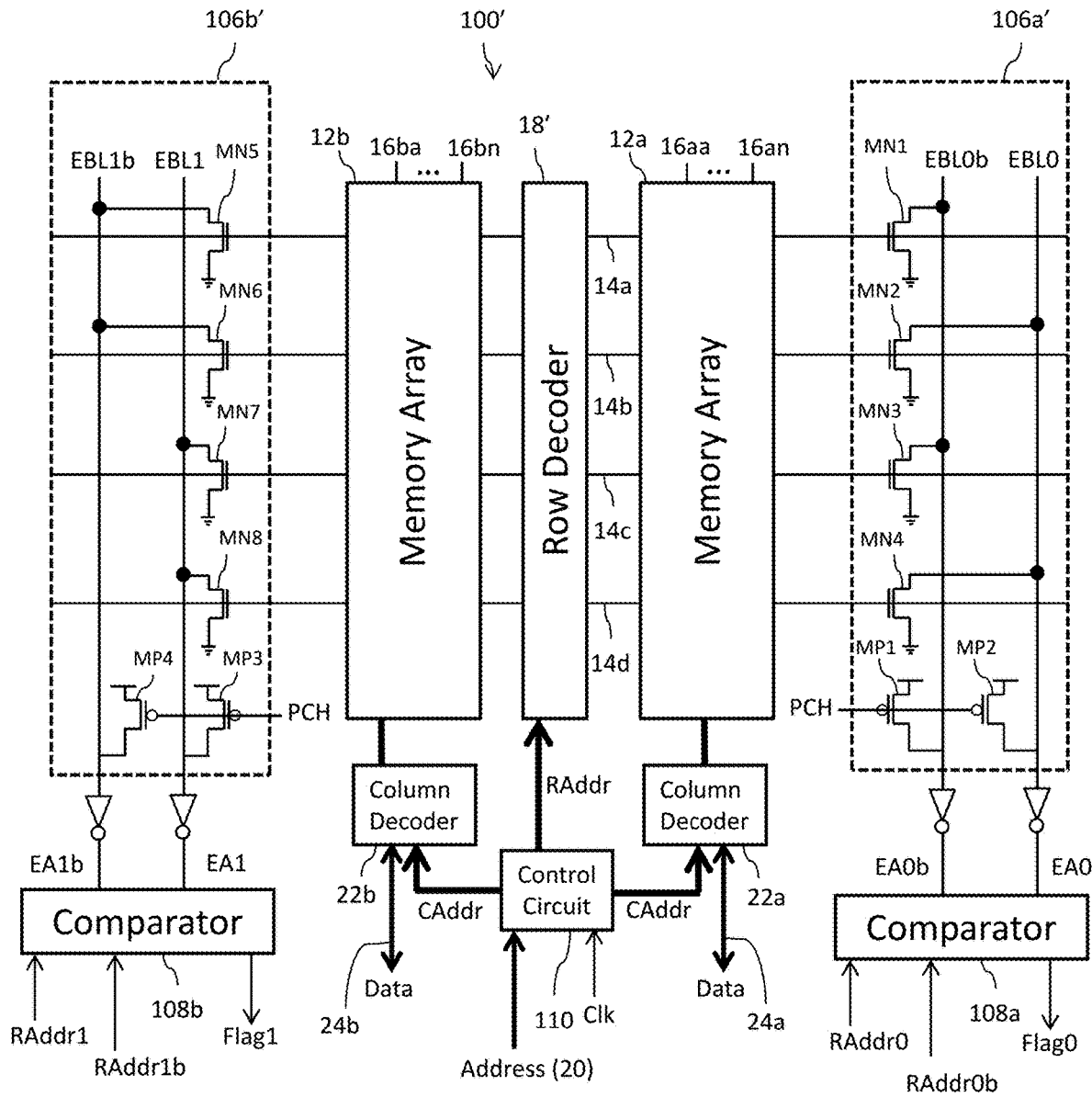
FIG. 4 is a simplified block diagram of the butterfly type memory circuit of FIG. 3 in which details of the word line error detection circuits are shown.

Shown in FIG. 4 is an embodiment of the circuit 100' in which this simplified example of the encoders 106a', 106b' is shown. Note that the word line 14a corresponds to a row address RAddr of 00, that the word line 14b corresponds to a row address RAddr of 01, that the word line 14c corresponds to a row address RAddr of 10, and that the word line 14d corresponds to a row address of 11. Also note that the output of each encoded address is inverted prior to being fed to the comparators 108a, 108b.

In the example shown, the encoder 106a' is comprised of one bit line transistor and two encoder bit lines per word line, and one precharge transistor per encoder bit line. To that end: n-channel transistor MN1 has its drain connected to the complementary encoder bit line EBL0b, its source connected to ground, and its gate connected to word line 14a; n-channel transistor MN2 has its drain connected to the encoder bit line EBL0, its source connected to ground, and its gate connected to word line 14b; n-channel transistor MN3 has its drain connected to the complementary encoder bit line EBL0b, its source connected to ground, and its gate connected to word line 14c; n-channel transistor MN4 has its drain connected to the encoder bit line EBL0, its source connected to ground, and its gate connected to word line 14d; p-channel transistor MP1 has its source connected to a supply voltage, its drain connected to the complementary encoder bit line EBL0b, and its gate connected to a precharge signal PCH; and p-channel transistor MP2 has its source connected to the supply voltage, its drain connected to the encoder bit line EBL0, and its gate connected to the precharge signal PCH.

The encoder 106b' is comprised of one bit line transistor per word line and two encoder bit lines per word line, and one precharge transistor per encoder bit line. To that end: n-channel transistor MN5 has its drain connected to the complementary encoder bit line EBL1b, its source connected to ground, and its gate connected to word line 14a; n-channel transistor MN6 has its drain connected to the complementary encoder bit line EBL1b, its source connected to ground, and its gate connected to word line 14b; n-channel transistor MN7 has its drain connected to the encoder bit line EBL1, its source connected to ground, and its gate connected to word line 14c; n-channel transistor MN8 has its drain connected to the encoder bit line EBL1, its source connected to ground, and its gate connected to word line 14d; p-channel transistor MP3 has its source connected to a supply voltage, its drain connected to the encoder bit line EBL1, and its gate connected to the precharge signal PCH; and p-channel transistor MP4 has its source connected to the supply voltage, its drain connected to the complementary encoder bit line EBL1b, and its gate connected to the precharge signal PCH.

As stated, the example of FIG. 4 is simplified, and actual implementations will contain a greater number of word lines, encoder bit lines, transistors, etc. In an actual implementation with an N-bit row address Raddr, the memory arrays 12a, 12b contain maximum $2^N$ word lines and the word line encoders 106a', 106b' collectively contain N encoder bit lines (with word line encoder 106a' therefore containing N/2 odd encoder bit lines and word line encoder 106b' therefore containing N/2 even encoder bit lines) together with complementary bit lines to those N encoder bit lines. Also note that for a N-bit row address Raddr, each of the word line encoders 106a', 106b' contains one transistor per N/2 encoder bit lines per word line, such that for a 2-bit row address Raddr each word line encoder 106a', 106b' includes 2/2=1 transistors per word line (one for each encoder bit line within that word line encoder 106a', 106b'), for a 4-bit row address each word line encoder 106a', 106b' would include 4/2=2 transistors per word line (one for each encoder bit line within that word line encoder 106a', 106b'), etc. Therefore, note that for a N-bit row address Raddr, the word line encoders 106a', 106b' collectively include one transistor per N encoder bit lines per word line, such that for a 2-bit row address Raddr the word line encoders 106a', 106b' collectively include 2 transistors per word line, for a 4-bit row address Raddr the word line encoders 106a', 106b' collectively include 4 transistors per word line, etc. Also note that the N encoder bit lines in word line encoder 106a' correspond to the odd bits of the encoded address EAddr, and that the N encoder bit lines in word line encoder 106b' correspond to even bits of the encoded address EAddr.

The inversion of the output of each encoded address prior to being fed to the comparator 108a, 108b represents one possible logic scheme that permits a direct comparison between EAddr and RAddr, and between EAddrB and RAddrB, but others may be used instead. For example, instead of the word lines 14a, 14b, 14c, 14d respectively corresponding to the row addresses 00, 01, 10, 11 and the inverters being present, the inverters could be removed and the word lines 14a, 14b, 14c, 14d could respectively correspond to the row addresses 11, 10, 01, 00. Differently, the word lines 14a, 14b, 14c, 14d could still respectively correspond to the row addresses 00, 01, 10, 11, but instead of RAddr being compared to EAddr and RAddrB being compared to EAddrB, RAddr could be compared to EAddrB and RAddrB could be compared to EAddr. Those skilled in the art will understand the numerous possible permutations.

Those skilled in the art will appreciate that the particular configuration of the encoders 106a', 106b' as shown is not required, and that other arrangements are possible and equally usable with the circuit 100' as will be appreciated by those of skill in the art.

Operation of the fault detection circuit 102 of FIG. 4 in the absence of an error may be better understood through consideration of an example as illustrated in FIGS. 5A-5D. Consider first FIG. 5A, in which there are no word line faults, and the address 20 has been predecoded by the control circuit 110 to generate a row address RAddr of 00. The row decoder 18' decodes this row address RAddr to select word line 14a. In response to that selection, the word line driver circuits of the row decoder 18' will drive word lines 14b, 14c and 14d to ground (logic low "0") and drive word line 14a to Vdd (logic high "1"). The encoder bit lines EBL0, EBL0b, EBL1, EBL1b are precharged by their respective precharge transistors MP1, MP2, MP3, MP4. Then, the word line 14a corresponding to row address RAddr=00 is activated. This results in: encoder bit line EBL0 being left high, and after inversion, being pulled low to output encoder bit EA0 as "0"; complementary encoder bit line EBL0b being pulled low by activation of transistor MN1, and after inversion, providing the encoder bit EA0b as a "1"; encoder bit line EBL1 being left high, and after inversion, being pulled low to output encoder bit EA1 as a "0"; and encoder bit line EBL1b being pulled low by activation of transistor MN5, and after inversion, providing the encoder bit EA1b as "1". Since EA0=RAddr0=0 and EA0b=RAddr0b=1, there is a match detected by the comparator 108a, and Flag0 is set; and since EA1=RAddr1=0 and EA1b=RAddr1b=1, there is a match detected by comparator 108b, and Flag1 is set. Since both Flag0 and Flag1 are set, no word line error is detected for the row address RAddr=00. Overall, notice that in this example, RAddr=EAddr=00 and RAddrB=EAddrB=11, and thus, there is no word line error, as stated.

Figure 5A:
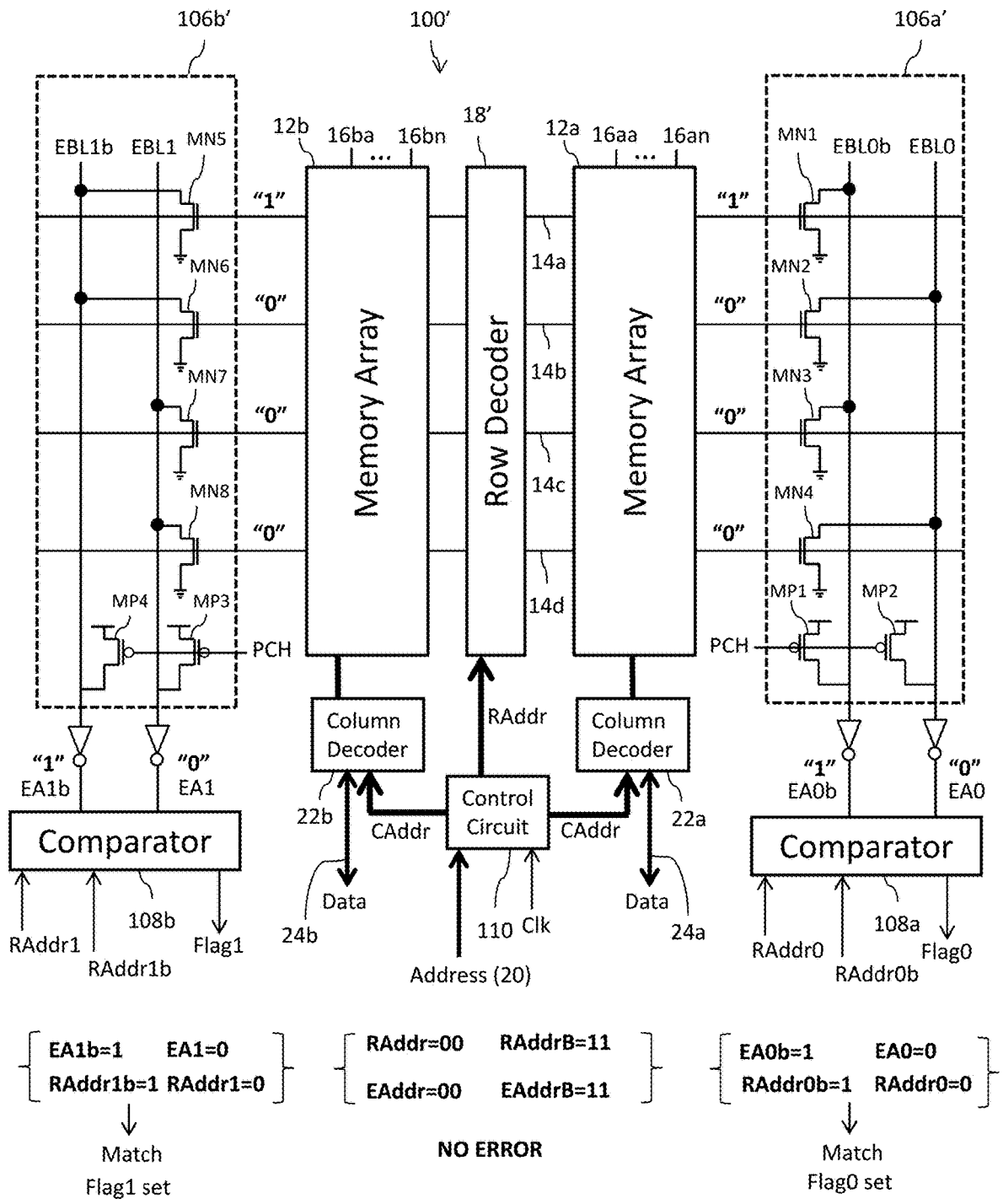
FIG. 5A shows the butterfly type memory circuit of FIG. 4 when operating to check word line 14a corresponding to an address of 00, and an error not being found.
Figure 5B:
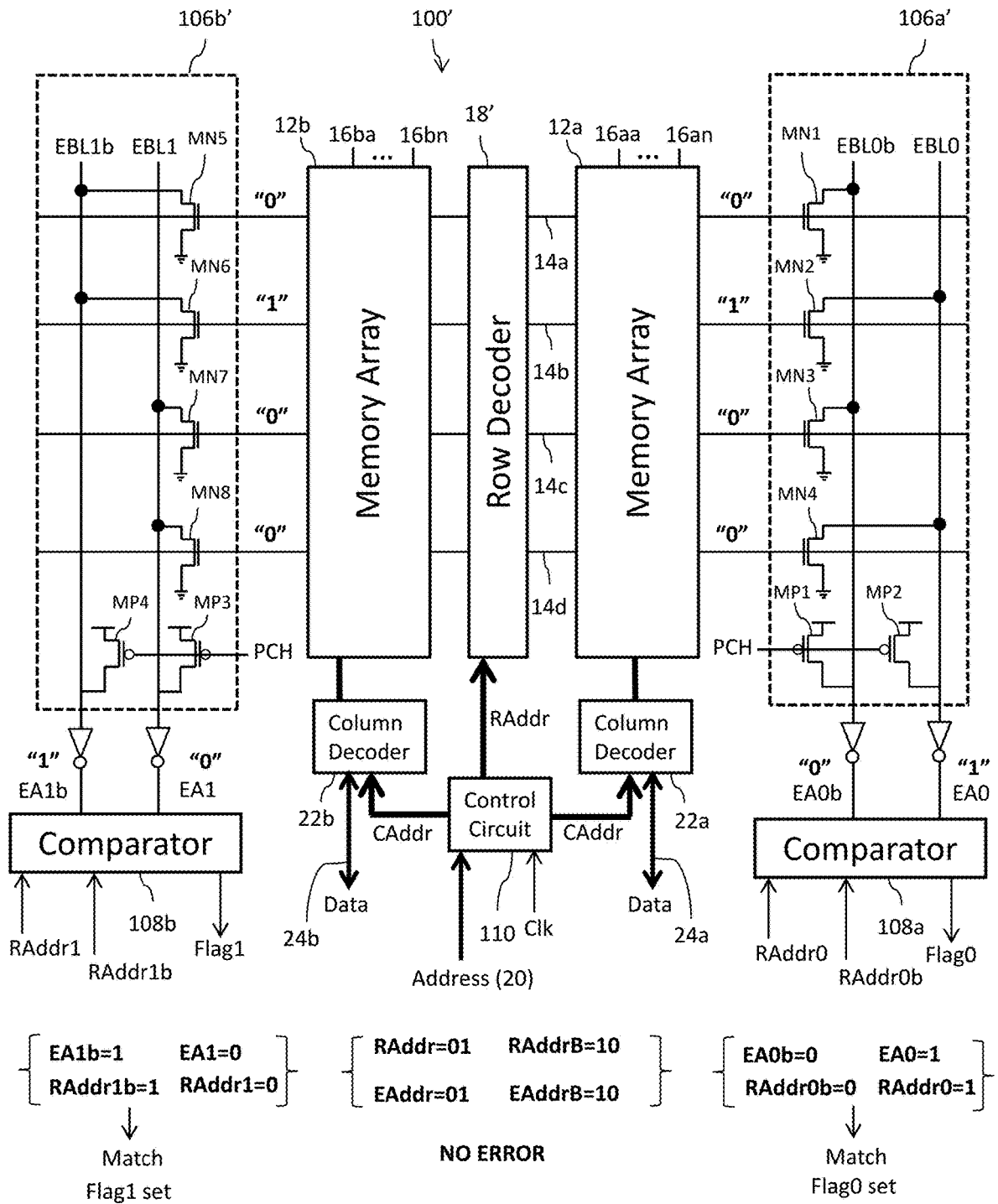
FIG. 5B shows the butterfly type memory circuit of FIG. 4 when operating to check word line 14b corresponding to an address of 01, and an error not being found.

Consider now FIG. 5B, in which there are no word line faults, and the row address RAddr is 01. First, all encoder bit lines EBL0, EBL0b, EBL1, EBL1b are precharged by their respective precharge transistors MP1, MP2, MP3, MP4. Then, the word line 14b corresponding to row address RAddr=01 is activated. This results in: encoder bit line EBL0 being pulled low by activation of transistor MN2, and after inversion, providing the encoder bit EA0 as a "1"; encoder bit line EBL0b being left high, and after inversion, being pulled low to output encoder bit EA0b as a "0"; encoder bit line EBL1 being left high, and after inversion, being pulled low to output encoder bit EA1 a "0"; and encoder bit line EBL1b being pulled low by activation of transistor MN6, and after inversion, providing the encoder bit EA1b as a "1". Since EA0=RAddr0=1 and EA0b=RAddr0b=0, there is a match detected by the comparator 108a, and Flag0 is set; and since EA1=RAddr1=0 and EA1b=RAddr1b=1, there is a match detected by comparator 108b, and Flag1 is set. Since both Flag0 and Flag1 are set, no word line error is detected for the row address RAddr=01. Overall, notice that in this example, RAddr=EAddr=01 and RAddrB=EAddrB=10, and thus, there is no word line error, as stated.

Figure 5C:
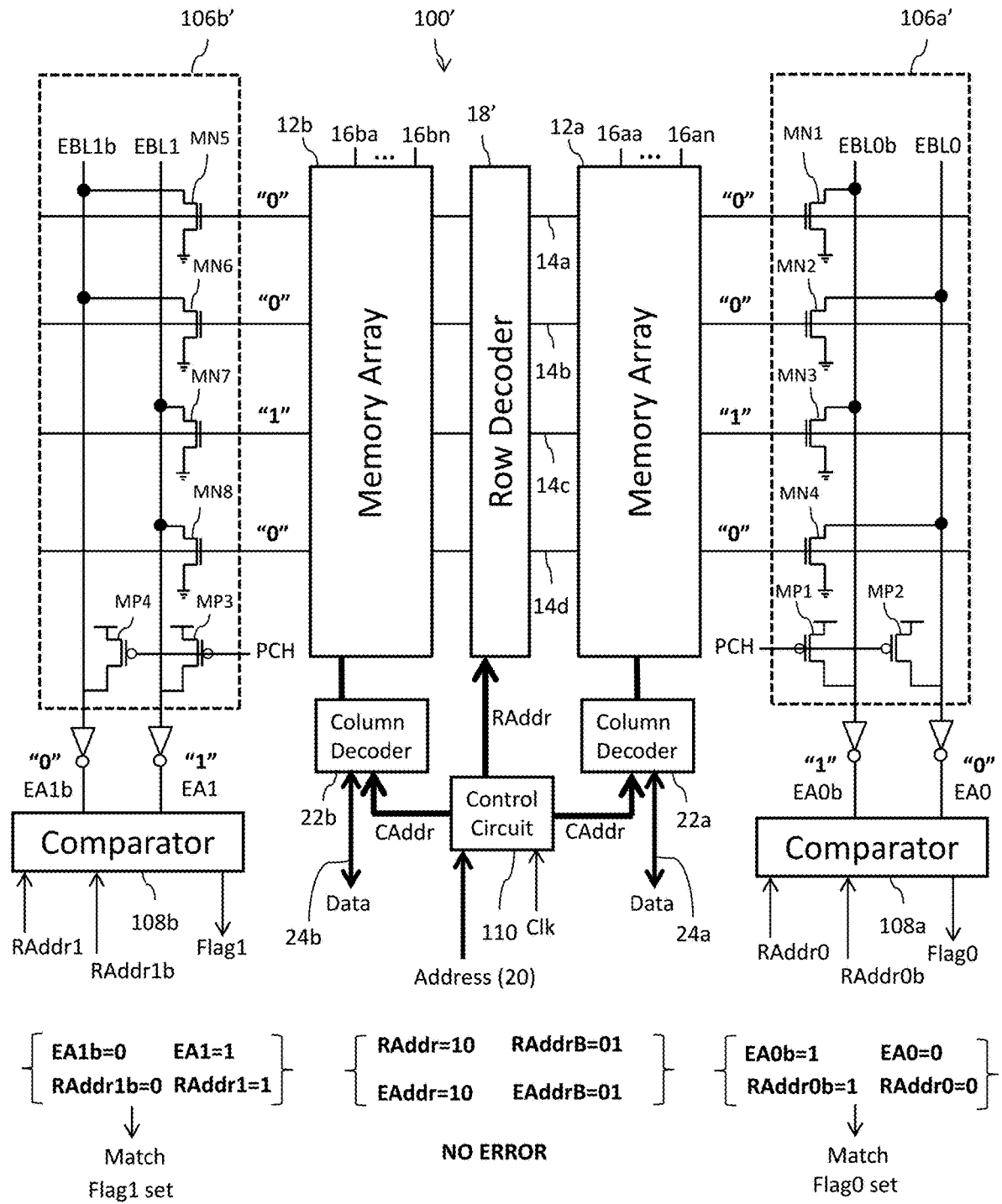
FIG. 5C shows the butterfly type memory circuit of FIG. 4 when operating to check word line 14c corresponding to an address of 10, and an error not being found.

Consider now FIG. 5C, in which there are no word line faults, and the row address RAddr is 10. First, all encoder bit lines EBL0, EBL0b, EBL1, EBL1b are precharged by their respective precharge transistors MP1, MP2, MP3, MP4. Then, the word line 14c corresponding to row address RAddr=10 is activated. This results in: encoder bit line EBL0 being left high, and after inversion, being pulled low to output encoder EA0 a "0"; encoder bit line EBL0b being pulled low by activation of transistor MN3, and after inversion, providing the encoder bit EA0b as "1"; encoder bit line EBL1 being pulled low by activation of transistor MN7, and after inversion, providing encoder bit EA1 as "1"; and encoder bit line EBL1b being left high, and after inversion, being pulled low to output encoder bit EA1b as "0". Since EA0=RAddr0=0 and EA0b=RAddr0b=1, there is a match detected by the comparator 108a, and Flag0 is set; and since EA1=RAddr1=1 and EA1b=RAddr1b=0, there is a match detected by comparator 108b, and Flag1 is set. Since both Flag0 and Flag1 are set, no word line error is detected for the row address RAddr=10. Overall, notice that in this example, RAddr=EAddr=10 and RAddrB=EAddrB=01, and thus, there is no word line error, as stated.

Figure 5D:
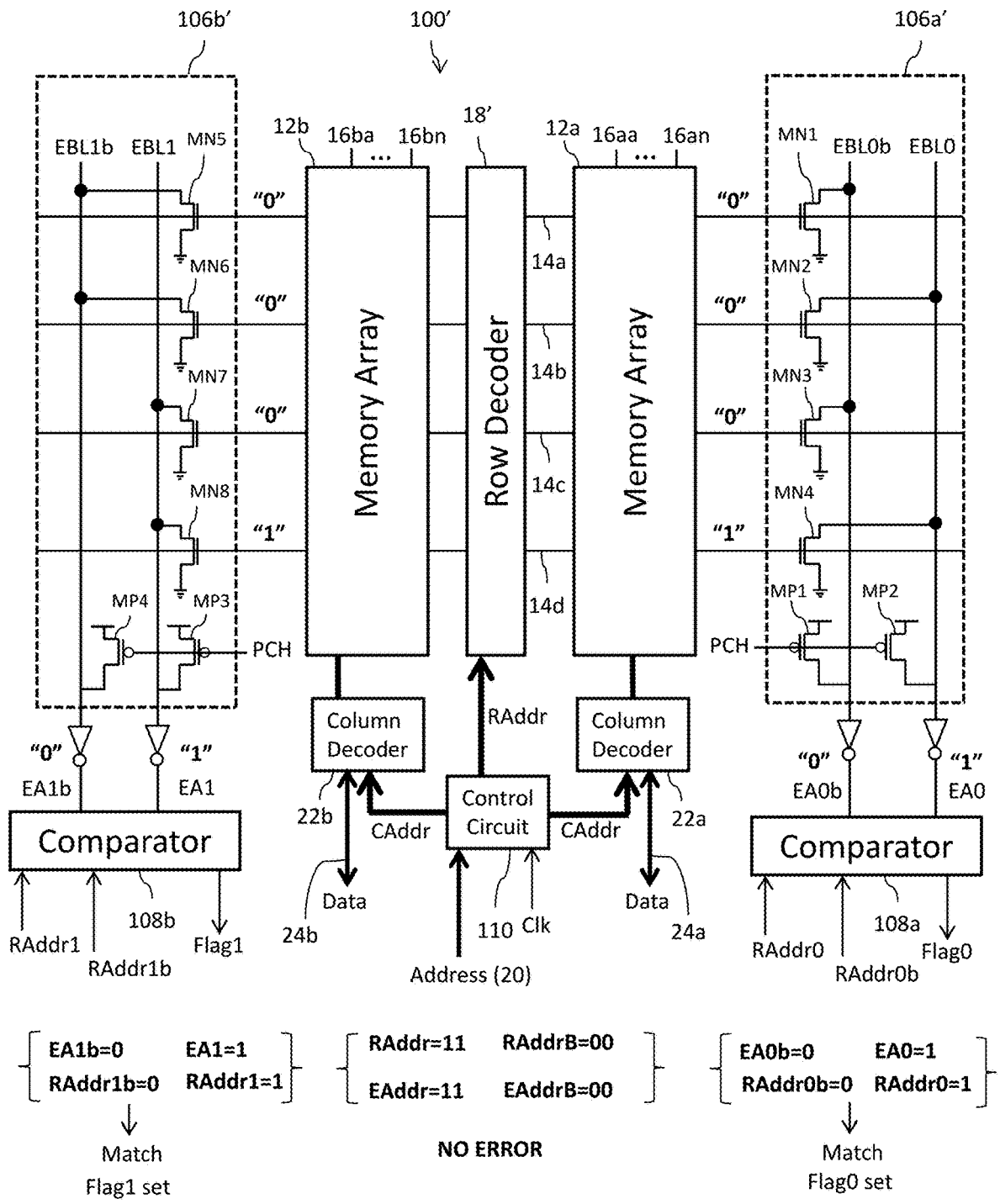
FIG. 5D shows the butterfly type memory circuit of FIG. 4 when operating to check word line 14d corresponding to an address of 11, and an error not being found.

Consider now FIG. 5D, in which there are no word line faults, and the row address RAddr is 11. First, all encoder bit lines EBL0, EBL0b, EBL1, EBL1b are precharged by their respective precharge transistors MP1, MP2, MP3, MP4. Then, the word line 14d corresponding to row address RAddr=11 is activated. This results in: encoder bit line EBL0 being pulled low by activation of transistor MN4, and after inversion, providing encoder bit EA0 as a "1"; encoder bit line EBL0b being left high, and after inversion, being pulled low to output encoder bit EA0b as a "0"; encoder bit line EBL1 being pulled low by activation of transistor MN8, and after inversion, providing encoder bit EA1 as "1"; and encoder bit line EBL1b being left high, and after inversion, being pulled low to output encoder bit EBL1b as "0". Since EA0=RAddr0=1 and EA0b=RAddr0b=0, there is a match detected by the comparator 108a, and Flag0 is set; and since EA1=RAddr1=1 and EA1b=RAddr1b=0, there is a match detected by comparator 108b, and Flag1 is set. Since both Flag0 and Flag1 are set, no word line error is detected for the row address RAddr=11. Overall, notice that in this example, RAddr=EAddr=11 and RAddrB=EAddrB=00, and thus, there is no word line error, as stated.

Figure 6A:
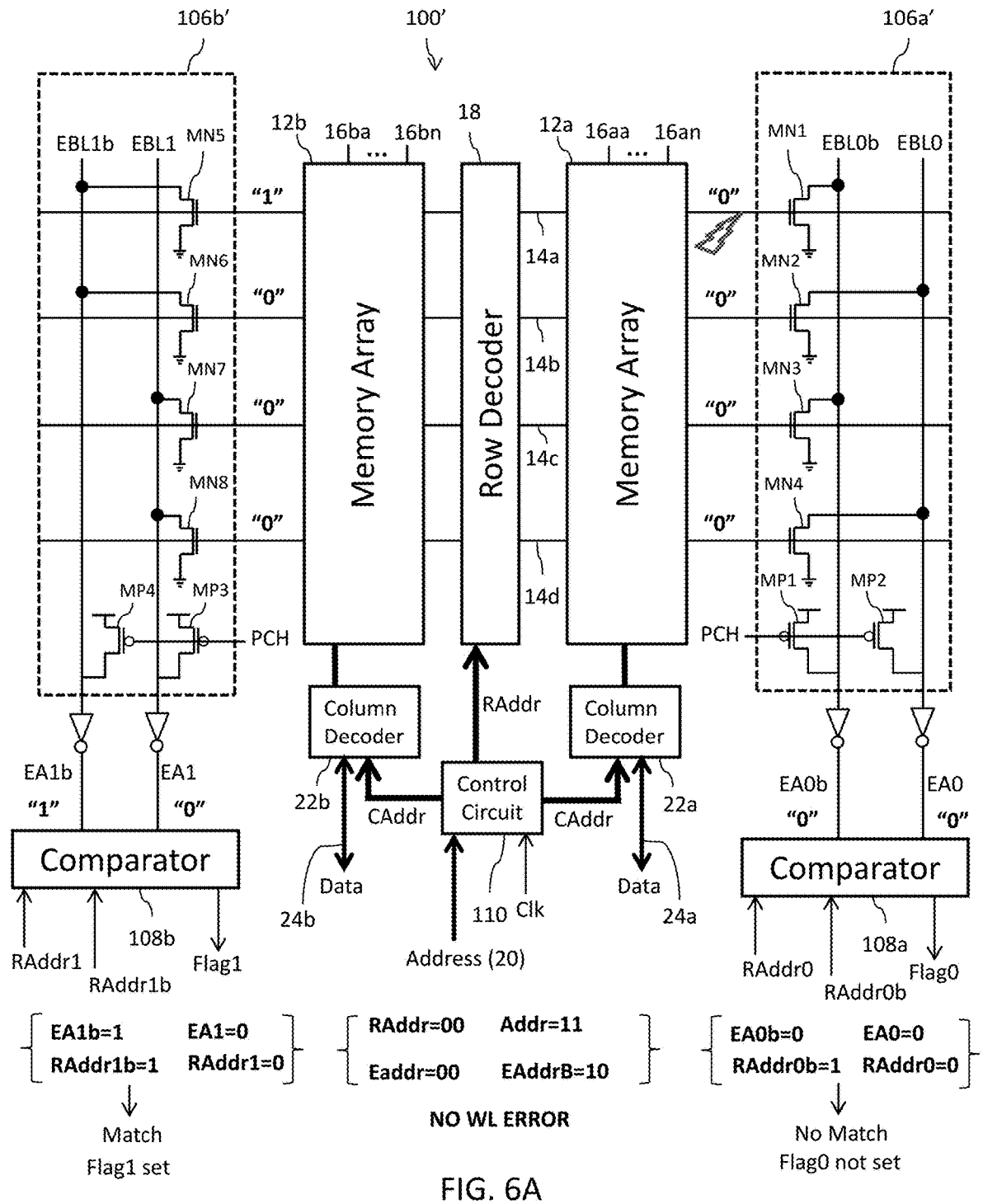
FIG. 6A shows the butterfly type memory circuit of FIG. 4 operating in detection of a "no word line" error.

Now, consider the fault cases. Reference is first made to FIG. 6A, in which the word line 14a extending from the row decoder 18' and into the memory array 12a experiences a fault. FIG. 6A shows that the address 20 has been predecoded by the control circuit 110 to generate a row address RAddr of 00. The row decoder 18' decodes this row address RAddr to select word line 14a. In response to that selection, the word line driver circuits of the row decoder 18' will attempt to drive word lines 14b, 14c and 14d to ground (logic low "0") and attempt to drive word line 14a to Vdd (logic high "1").

Due to the fault experienced by the word line 14a, despite the row decoder 18' attempting to drive word line 14a to a logic high, the word line 14a as extending from the memory array 12a toward the word line encoder 106a' will not be driven to a logic high, and thus n-channel transistor MN1 will not turn on. The result is that: the decoder bit line EBL0 is left high, and after inversion, is pulled low to output encoder bit EA0 as "0"; the complementary decoder bit line EBL0b is left high, and after inversion, is pulled low to output encoder bit EA0b as "0"; the decoder bit line EBL1 is left high, and after inversion, is pulled low to output encoder bit EA1 as "0"; and the decoder bit line EBL1b is pulled low by activation of transistor MN5, and after inversion, provides encoder bit EA0b as "1". Since EA0b=0 but RAddr0b=1, there is a mismatch detected by the comparator 108a, and Flag® is not asserted. However, since RAddr1=EA1=0 and RAddr1b=EA1b=1, there is not a mismatch detected by the comparator 108b, and Flag1 is still asserted. However, since both Flag0 and Flag1 are not asserted, a word line error is known to be present for memory array 12a at row address RAddr=00, which in this case is a no word line error (e.g. word line 14a should have been pulled high but did not deliver a logic high to the memory array 12a).

Figure 6B:
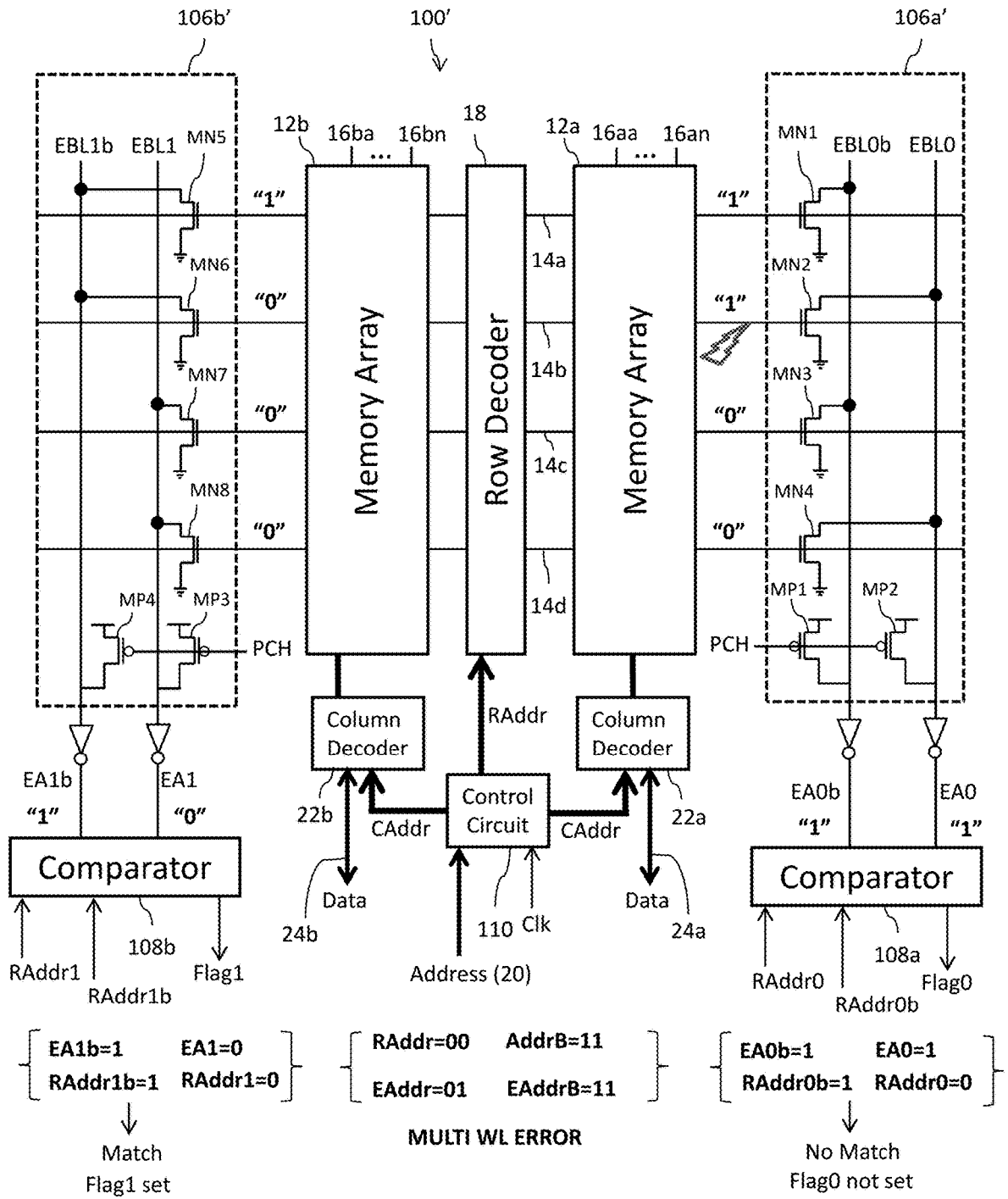
FIG. 6B shows the butterfly type memory circuit of FIG. 4 operating in detection of a "multi-word line" error.

Reference is now made to FIG. 6B, in which the word line 14b extending from the row decoder 18' and into the memory array 12a experiences a fault. FIG. 6B shows that the address 20 has been predecoded by the control circuit 110 to generate a row address RAddr of 00. The row decoder 18' decodes this row address RAddr to select word line 14a. In response to that selection, the word line driver circuits of the row decoder 18' will attempt to drive word lines 14c and 14d to ground (logic low "0"), will attempt to drive word line 14b to ground (logic low "0"), and will attempt to drive word line 14a to Vdd (logic high "1"). Due to the fault experienced by the word line 14b, despite the row decoder 18' attempting to drive the word line 14b to a logic low, the word line 14b as extending from the memory array 12a toward the word line encoder 106a' will not be driven to a logic low and will instead be driven to a logic high. However, the word line 14b as extending from the memory array 12b toward the word line encoder 106b' will be properly driven to a logic low.

The result of this is that transistors MN1 and MN2 will both turn on. The result is that: the encoder bit line EBL0 is pulled low due to transistor MN2 turning on, and after inversion, outputs encoder bit EA0 as "1"; the complementary encoder bit line EBL0b is pulled low due to transistor MN1 turning on, and after inversion, outputs encoder bit EA0b as "1"; the encoder bit line EBL1 is left high, and after inversion, is pulled low to output encoder bit EA1 as "0"; and the complementary encoder bit line EBL1b is pulled low due to transistor MN5 turning on, and after inversion, outputs encoder bit EA1b as a "1". Since EA0=1 but RAddr0=0, there is a mismatch detected by the comparator 108a, and Flag® is not asserted. However, since RAddr1=EA1=0 and RAddr1b=EA1b=1, there is not a mismatch detected by the comparator 108b, and Flag1 is still asserted. However, since both Flag® and Flag1 are not asserted, a word line error is known to be present for memory array 12a at row address RAddr=00, which in this case is a multi word line error (e.g. word line 14b should have been pulled low but did delivered a logic high to the memory array 12a, meaning that word lines 14a and 14b were both asserted for memory array 12a).

Figure 6C:
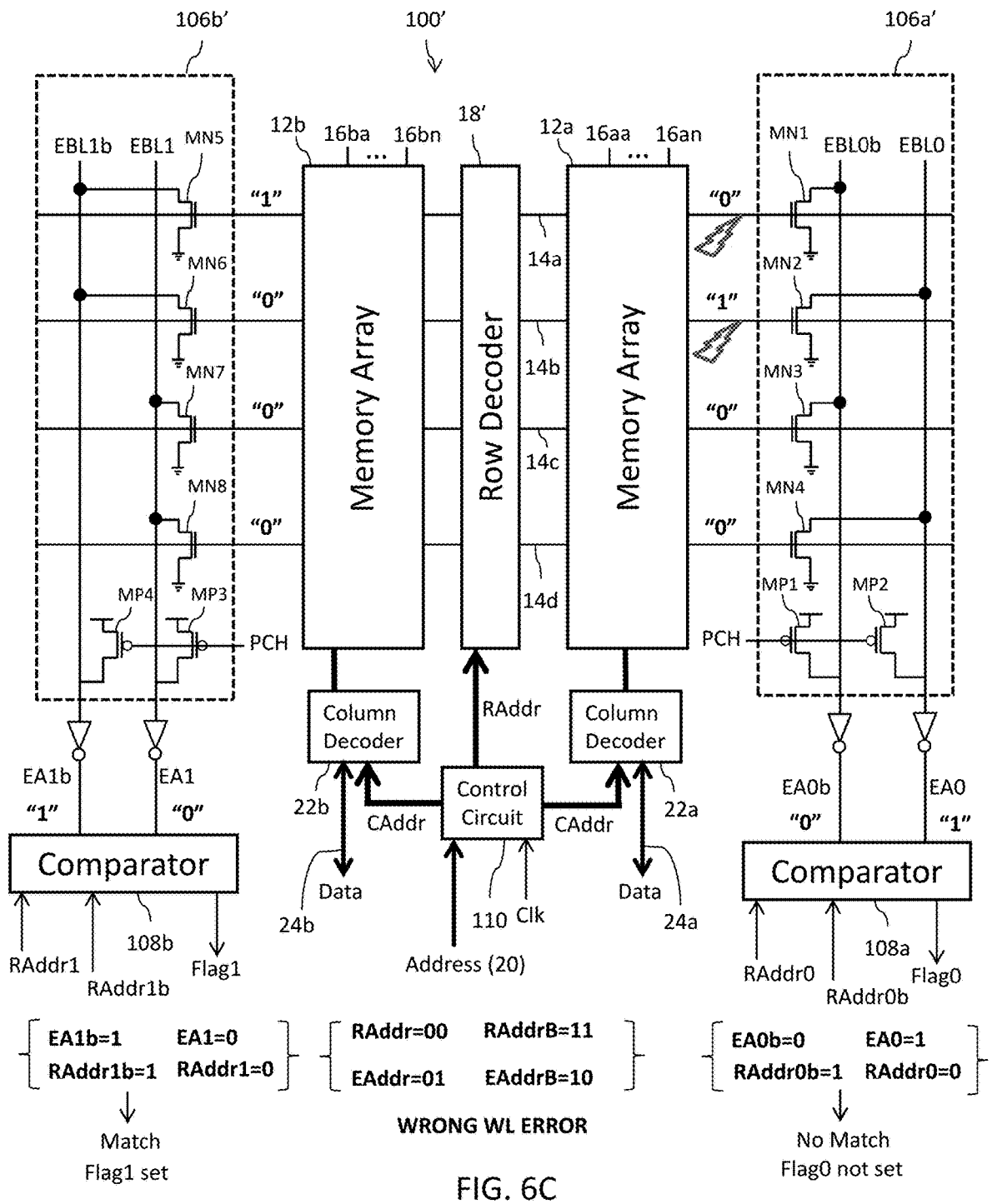
FIG. 6C shows the butterfly type memory circuit of FIG. 4 operating in detection of a "wrong word line" error.

Reference is now made to FIG. 6C, in which the word lines 14a and 14b extending from the row decoder 18' and into the memory array 12a both experience a fault. FIG. 6C shows that the address 20 has been predecoded by the control circuit 110 to generate a row address RAddr of 00. The row decoder 18' decodes this row address RAddr to select word line 14a. In response to that selection, the word line driver circuits of the row decoder 18' will attempt to drive word lines 14c and 14d to ground (logic low "0"), attempt to drive word line 14a to Vdd (logic high "1"), and attempt to drive word line 14b to ground (logic low "0"). Due to the fault experienced by the word line 14a, despite the row decoder 18' attempting to drive the word line 14a to a logic high, the word line 14a as extending from the memory array 12a toward the word line encoder 106a' will not be driven to a logic high and will instead be driven to a logic low. However, the word line 14a as extending from the memory array 12b toward the word line encoder 106b' will be properly driven to a logic high.

Due to the fault experienced by the word line 14b, despite the row decoder 18' attempting to drive the word line 14b to a logic low, the word line 14b as extending from the memory array 12a toward the word line encoder 106a' will not be driven to a logic low and will instead be driven to a logic high. However, the word line 14b as extending from the memory array 12b toward the word line encoder 106b' will be properly driven to a logic low.

The result of this is that transistor MN1 improperly does not turn on, and that transistor MN2 improperly turns on. The result is that: the encoder bit line EBL0 is pulled low due to transistor MN2 turning on, and after inversion, provides encoder bit EA0 as a "1"; the complementary encoder bit line EBL0b is left high, and after inversion, provided encoder bit EA0b as a "0"; the encoder bit line EBL1 is left high, and after inversion, is pulled low to output encoder bit EA1 as "0"; and the complementary encoder bit line EBL1b is pulled low due to transistor MN5 turning on, and after inversion, outputs encoder bit EA1b as a "1". Since EA0=1 but RAddr0=0, and since EA0b=0 but RAddr0b=1, there is a mismatch detected by the comparator 108a, and Flag® is not asserted. However, since RAddr1=EA1=0 and RAddr1b=EA1b=1, there is not a mismatch detected by the comparator 108b, and Flag1 is still asserted. However, since both Flag® and Flag1 are not asserted, a word line error is known to be present for memory array 12a at row address RAddr=00, which in this case is a wrong word line error (e.g. word line 14a should have been pulled high but did not deliver a logic high to the memory array 12a, and word line 14b should have been pulled low but delivered a logic high to the memory array 12a, meaning that word lines 14a was not asserted and word line 14b was asserted for memory array 12a).

It should be noticed that Flag® not being asserted indicates a word line error within memory array 12a, while Flag1 not being asserted indicates a word line error within memory array 12b. In addition, the type of word line error can be discerned from which bit lines did not match. For example, a no word line error results from a mismatch between RaddrB and EAddrB (but not between RAddr and EAddr), a multi word line error results from a mismatch between RAddr and EAddr (but not between RAddrB and EAddrB), and a wrong word line error results from a mismatch between RAddr and EAddr as well as RAddrB and EAddrB. Logic circuitry within the comparators 108a, 108b can assert or deassert suitable additional flags for the above, so that the specific kind of error in addition to the location of the error can be known.

In the above examples, the word line errors occurred in the memory array 12a. However, the word line errors could also occur in memory array 12b, or in both of the memory arrays 12a, 12b and would be similar detected. Therefore, using a single encoder (a 4×2 encoder, in the examples shown) split into two halves 106a', 106b' on the periphery of the memory arrays 12a, 12b permits detection of the above three noted fault cases in both memory arrays 102a, 12b, while not utilizing the amount of space as using a different single encoder for each memory array 12a, 12b. In addition, the percentage of such errors successfully detected by the circuit 100 is much greater than prior art designs, while consuming the same or less area with the word line fault detection circuitry.

It should be appreciated that, while the above examples have been given with regard to the use of a single encoder split into two parts for detection of word line errors, errors with other metal word lines in a butterfly type memory circuit may be detected using the same technique.

Figure 7:
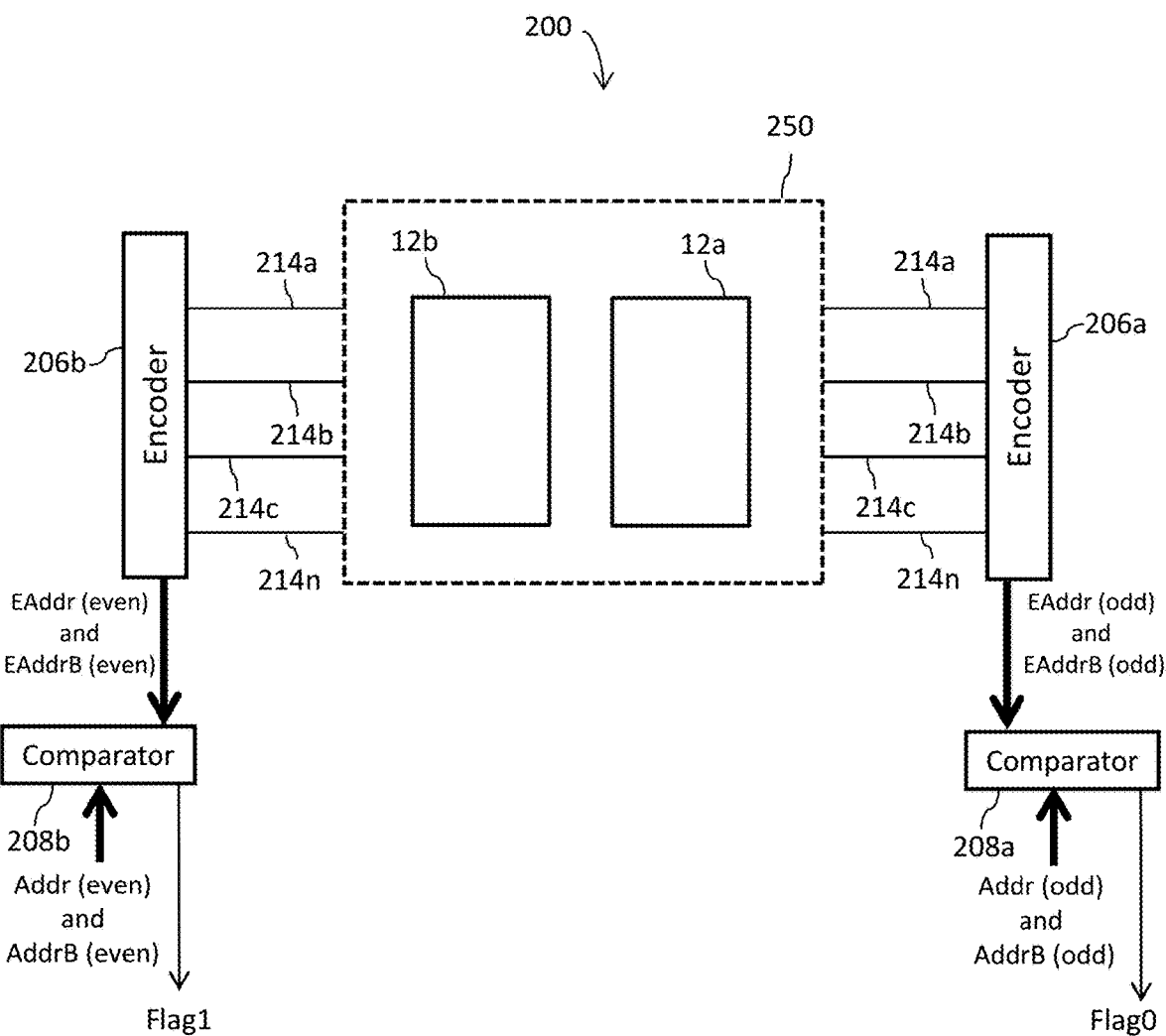
FIG. 7 is a block diagram of a butterfly type memory circuit with a line error detection circuit for each side.

Reference is now made to FIG. 7 which shows block diagram of a memory circuit 200 that has the capability of detecting a high percentage of no line, multiple line, and incorrect line errors should they occur during operation, with it being understood that the lines being referred to are any lines common to both sides of the butterfly type memory circuit and serve to carry signals produced by any control components of the butterfly type memory circuit (e.g., column selection lines, bitline precharge lines, sense enable lines, read/write selection lines, bank selection lines, etc). So as to help illustrate the wide scope, the memory circuit 200 is illustrated as being split into three blocks: a central block 250, which includes first and second arrays 12a, 12b of memory cells as well as any of the type of control circuitry noted above in this paragraphs, a right side encoder 206a, and a left side encoder 206b. To emphasize the fact that any such control circuitry may be used, it need not be illustrated, with it understood that such control circuitry provides output to lines 214a . . . 214n, and that in operation, one of the lines 214a-214d is to be asserted while the others of the lines 214a . . . 214n are to be deasserted. Therefore, error occurs if none of the lines 214a . . . 214n is asserted, if a wrong one of the lines 214a . . . 214n is asserted, or if two or more of the lines 214a . . . 214n is asserted.

The circuit 200 includes line encoder circuits 206a, 206b that cooperate with comparators 208a, 208b to detect line faults. The line encoder circuits 206a, 206n are connected to each of the lines 214a . . . 214n and operate to encode the signals on the lines 214a . . . 214n to collectively generate an encoded address EAddr and its complement EAddrB for output and comparison with a reference address Addr (representing line 214a . . . 214n should be asserted) and its complement AddrB. The encoded address EAddr, if an error is not present, will be the same as the reference address Addr, and complement encoded address EaddrB, if an error is not present, will be the same as the complement of the reference address AddrB. Comparators 208a, 208b collectively serve to compare the encoded address EAddr and its complement EAddrB to the reference address Addr and its complement AddrB and assert respective output flags Flag®, Flag1 based upon detected matches, meaning that Flag® and/or Flag1 will be deasserted in the presence of a line error.

In particular, the line encoder 206a encodes the signals on its associated encoder bitlines to thereby generate the odd bits of the encoded address, which will be denoted as EAddr(odd), as well as the complements of the odd bits of the encoded address, which will be denoted as EAddrB (odd). Likewise, line encoder 206b encodes the signals on its associated encoder bitlines to thereby generate the even bits of the encoded address, which will be denoted as EAddr (even), as well as the complements of the even bits of the encoded address, which will be denoted as EAddrB(even).

In particular, the comparator 208a receives the odd bits of the reference address Addr(odd) and complementary reference address AddrB(odd), and the comparator 208b receives the even bits of the reference address Addr(even) and complementary reference address AddrB(even). The comparator 208a compares the odd bits of the encoded address EAddr(odd) to the odd bits of the reference address Addr (odd) and compares the odd bits of the complement encoded address EAddrB(odd) to the odd bits of the complement reference address AddrB(odd), and then asserts Flag® if both EAddr(odd)=Addr(odd) and EAddrB(odd)=AddrB (odd). The comparator 208b compares the even bits of the encoded address EAddr(even) to the even bits of the reference address Addr(even) and compares the even bits of the complement encoded address EAddrB(even) to the even bits of the complement reference address AddrB(even), then asserts Flag1 if both EAddr(even)=Addr(even) and EAddrB (even)=AddrB(even).

By evaluating the individual flags Flag® and Flag1 and/or the combination of Flag® and Flag1, fault cases can be detected. Indeed, the comparator circuits 208a, 208b collectively can detect the three different fault outlined above.

The purpose of splitting the line encoding between two encoders 206a, 206b is so that errors on both sides of memory arrays 12a, 12b can be detected. If there were one encoder, line errors with only one of the memory arrays 12a, 12b could be detected.

Note that FIG. 7 applies to any size memory array, and thus any size address and encoded address may be present.

In order to allow for ease of explanation and illustration, simplified examples will now be given that assume that the line address is a two bit address, and that there are therefore four lines 214a-214d. The structure for real world implementations where the address itself is a greater number of bits will be evident to those of skill in the art upon review of these examples, as will operation.

Figure 8:
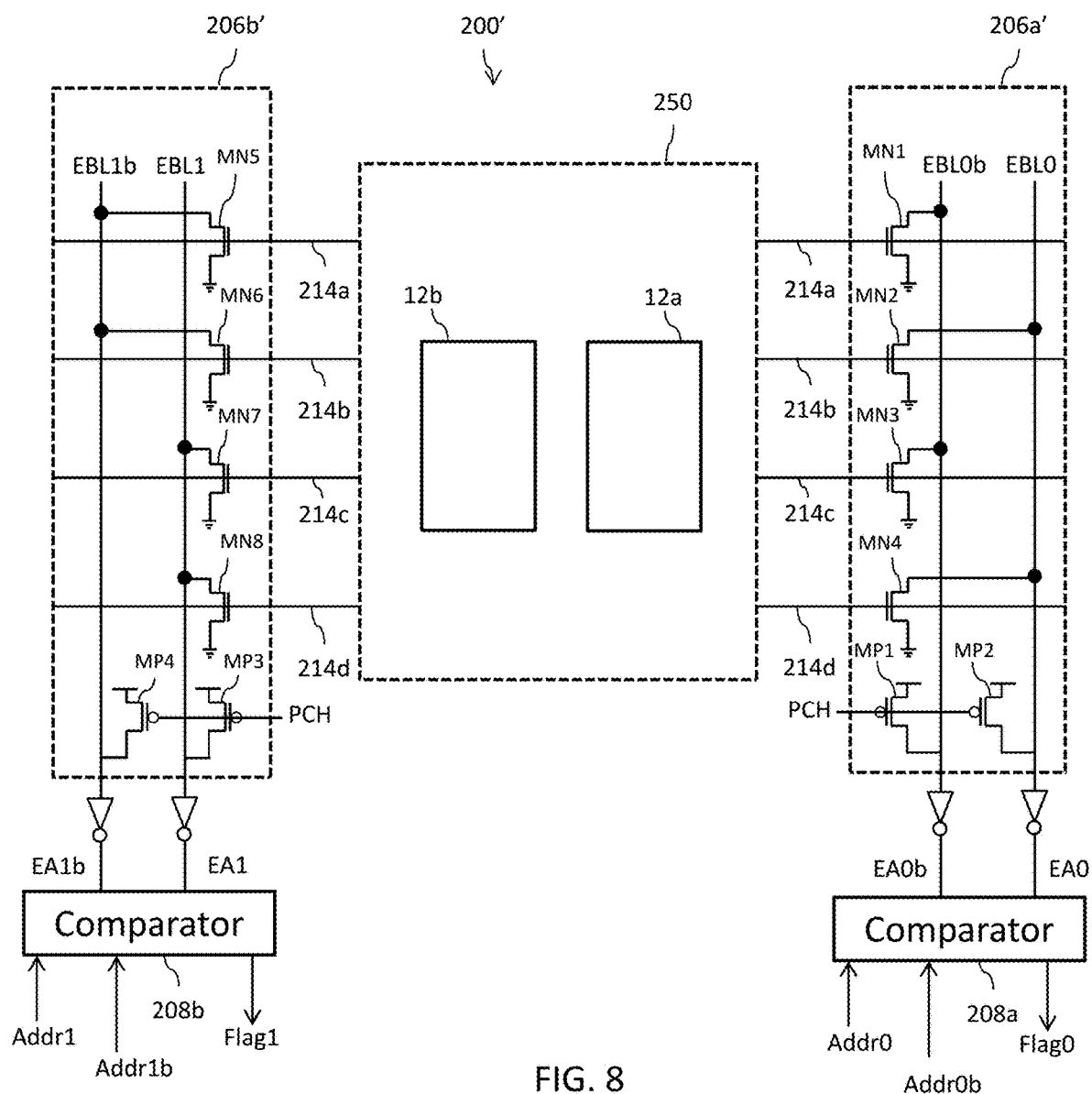
FIG. 8 is a simplified block diagram of the butterfly type memory circuit of FIG. 7 in which details of the line error detection circuits are shown.

Shown in FIG. 8 is an embodiment of the circuit 200' in which this simplified example of the encoders 206a', 206b' is shown. Note that the line 214a corresponds to a reference address Addr of 00, that the line 214b corresponds to a reference address Addr of 01, that the line 214c corresponds to a reference address Addr of 10, and that the line 214d corresponds to a reference address of 11. Also note that the output of each encoded address is inverted prior to being fed to the comparators 208a, 208b.

In the example shown, the encoder 206a' is comprised of one bit line transistor and two encoder bit lines per line, and one precharge transistor per encoder bit line. To that end: n-channel transistor MN1 has its drain connected to the complementary encoder bit line EBL0b, its source connected to ground, and its gate connected to line 214a; n-channel transistor MN2 has its drain connected to the encoder bit line EBL0, its source connected to ground, and its gate connected to line 214b; n-channel transistor MN3 has its drain connected to the complementary encoder bit line EBL0b, its source connected to ground, and its gate connected to line 214c; n-channel transistor MN4 has its drain connected to the encoder bit line EBL0, its source connected to ground, and its gate connected to line 214d; p-channel transistor MP1 has its source connected to a supply voltage, its drain connected to the complementary encoder bit line EBL0b, and its gate connected to a precharge signal PCH; and p-channel transistor MP2 has its source connected to the supply voltage, its drain connected to the encoder bit line EBL0, and its gate connected to the precharge signal PCH.

The encoder 206b' is comprised of one bit line transistor per line and two encoder bit lines per line, and one precharge transistor per encoder bit line. To that end: n-channel transistor MN5 has its drain connected to the complementary encoder bit line EBL0b, its source connected to ground, and its gate connected to line 214a; n-channel transistor MN6 has its drain connected to the complementary encoder bit line EBL0b, its source connected to ground, and its gate connected to line 214b; n-channel transistor MN7 has its drain connected to the encoder bit line EBL1, its source connected to ground, and its gate connected to line 214c; n-channel transistor MN8 has its drain connected to the encoder bit line EBL1, its source connected to ground, and its gate connected to line 214d; p-channel transistor MP3 has its source connected to a supply voltage, its drain connected to the encoder bit line EBL1, and its gate connected to the precharge signal PCH; and p-channel transistor MP4 has its source connected to the supply voltage, its drain connected to the complementary encoder bit line EBL0b, and its gate connected to the precharge signal PCH.

As stated, the example of FIG. 8 is simplified, and actual implementations will contain a greater number of lines, encoder bit lines, transistors, etc. In an actual implementation, for an N-bit address Addr, the memory arrays 12a, 12b contain maximum $2^N$ lines and the encoders 206a', 206b' collectively contain N encoder bit lines (with line encoder 206a' therefore containing N/2 odd encoder bit lines and line encoder 206b' therefore containing N/2 even encoder bit lines) together with complementary bit lines to those N encoder bit lines. Also note that for an N-bit address Aaddr, each of the encoders 206a', 206b' contains one transistor per N/2 encoder bit lines per line, such that for a 2-bit address Addr each encoder 206a', 206b' includes 2/2=1 transistors per line (one for each encoder bit line within that encoder 206a', 206b'), for a 4-bit address each encoder 206a', 206b' would include 4/2=2 transistors per line (one for each encoder bit line within that encoder 206a', 206b'), etc. Therefore, note that for a N-bit address Addr, the encoders 206a', 206b' collectively include one transistor per N encoder bit lines per line, such that for a 2-bit address Addr the encoders 206a', 206b' collectively include 2 transistors per line, for a 4-bit address Addr the encoders 206a', 206b' collectively include 4 transistors per line, etc. Also note that the N encoder bit lines in encoder 206a' correspond to the odd bits of the encoded address EAddr, and that the N encoder bit lines in encoder 206b' correspond to even bits of the encoded address EAddr.

The inversion of the output of each encoded address prior to being fed to the comparator 208a, 208b represents one possible logic scheme that permits a direct comparison between EAddr and Addr, and between EAddrB and AddrB, but others may be used instead. For example, instead of the lines 214a, 214b, 214c, 214d respectively corresponding to the reference addresses 00, 01, 10, 11 and the inverters being present, the inverters could be removed and the lines 214a, 214b, 214c, 214d could respectively correspond to the reference addresses 11, 10, 01, 00. Differently, the lines 214a, 214b, 214c, 214d could still respectively correspond to the addresses 00, 01, 10, 11, but instead of Addr being compared to EAddr and AddrB being compared to EAddrB, Addr could be compared to EAddrB and AddrB could be compared to EAddr. Those skilled in the art will understand the numerous possible permutations.

Those skilled in the art will appreciate that the particular configuration of the encoders 206a', 206b' as shown is not required, and that other arrangements are possible and equally usable with the circuit 200' as will be appreciated by those of skill in the art.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
a first memory array;
a second memory array;
a plurality of word lines common to the first memory array and the second memory array, wherein the plurality of word lines is comprised of 2N word lines;
a row decoder configured to selectively drive the plurality of word lines in response to a row address, wherein the row address is comprised of N bits;
a first word line fault detection circuit associated with the first memory array, the first word line fault detection circuit configured to encode signals on the plurality of word lines to generate a first encoded value;

wherein the first word line fault detection circuit comprises:
N/2 bit lines;
N/2 complementary bit lines for the N/2 bit lines;
one transistor per bit line; and
one transistor per complementary bit line;
a second word line fault detection circuit associated with the second memory array, the second word line fault detection circuit configured to encode signals on the plurality of word lines to generate a second encoded value;
wherein the second word line fault detection circuit comprises:
N/2 bit lines;
N/2 complementary bit lines for the N/2 bit lines;
one transistor per bit line; and
one transistor per complementary bit line; and
comparison circuitry configured to compare the first encoded value to a first expected value corresponding to a first portion of the row address and to compare the second encoded value to a second expected value corresponding to a second portion of the row address, wherein the comparison circuitry is configured to assert at least one error flag indicating presence of a word line fault based upon one or more of: a lack of match between the first encoded value and the first expected value and a lack of match between the second encoded value and the second expected value.

2. The circuit of claim 1, wherein the row decoder is located between the first memory array and the second memory array.

3. The circuit of claim 2, wherein the first word line fault detection circuit is located adjacent to the first memory array on a side thereof opposite to the row decoder.

4. The circuit of claim 2, wherein the second word line fault detection circuit is located adjacent to the second memory array on a side thereof opposite to the row decoder.

5. The circuit of claim 1, wherein the comparison circuitry comprises:
a first comparison circuit configured to compare the first encoded value to the first expected value corresponding to the first portion of the row address and to assert a first error flag indicating presence of a word line fault with the first memory array based upon a lack of match between the first encoded value and the first expected value; and
a second comparison circuit configured to compare the second encoded value to the second expected value corresponding to the second portion of the row address and to assert a second error flag indicating presence of a word line fault with the second memory array based upon a lack of match between the second encoded value and the second expected value.

6. The circuit of claim 1, wherein the first word line fault detection circuit and the second word line fault detection circuit collectively define a word line encoder configured to generate a total encoded value from signals on the plurality of word lines, the total encoded value including the first encoded value and the second encoded value.

7. The circuit of claim 1, wherein the N/2 bit lines of the first word line fault detection circuit correspond to odd bits of the row address; and wherein the N/2 bit lines of the second word line fault detection circuit correspond to even bits of the row address.

8. The circuit of claim 1, wherein the first word line fault detection circuit has its transistors connected to its N/2 bit lines and N/2 complementary bit lines in a first configuration pattern in which each transistor of the first word line fault detection circuit is connected to couple one of the N/2 bit lines of the first word line fault detection circuit or one of the N/2 complementary bit lines of the first word line fault detection circuit to ground in response to assertion of an associated one of the plurality of word lines;
wherein the second word line fault detection circuit has its transistors connected to its N/2 bit lines and N/2 complementary bit lines in a second configuration pattern in which each transistor of the second word line fault detection circuit is connected to couple one of the N/2 bit lines of the second word line fault detection circuit or one of the N/2 complementary bit lines of the second word line fault detection circuit to ground in response to assertion of an associated one of the plurality of word lines; and
wherein the second configuration pattern is different than the first configuration pattern.

9. The circuit of claim 1, wherein the first word line fault detection circuit comprises at least:
a first bit line;
a first complementary bit line;
a first n-channel transistor having a drain connected to the first bit line, a source connected to ground, and a gate connected to a first of the plurality of word lines;
a second n-channel transistor having a drain connected to the first complementary bit line, a source connected to ground, and a gate connected to a second of the plurality of word lines;
a third n-channel transistor having a drain connected to the first bit line, a source connected to ground, and a gate connected to a third of the plurality of word lines; and
a fourth n-channel transistor having a drain connected to the first complementary bit line, a source connected to ground, and a gate connected to a fourth of the plurality of word lines.

10. The circuit of claim 9, wherein the second word line fault detection circuit comprises at least:
a second bit line;
a second complementary bit line;
a fifth n-channel transistor having a drain connected to the second complementary bit line, a source connected to ground, and a gate connected to the first of the plurality of word lines;
a sixth n-channel transistor having a drain connected to the second complementary bit line, a source connected to ground, and a gate connected to the second of the plurality of word lines;
a seventh n-channel transistor having a drain connected to the second bit line, a source connected to ground, and a gate connected to the third of the plurality of word lines; and
an eighth n-channel transistor having a drain connected to the second bit line, a source connected to ground, and a gate connected to the fourth of the plurality of word lines.

11. A circuit, comprising:
a first memory array;
a second memory array;
$2^N$ word lines common to the first memory array and the second memory array;
a row decoder configured to selectively drive the $2^N$ word lines in response to an N-bit row address;
a first word line fault detection circuit associated with the first memory array, the first word line fault detection circuit configured to encode signals on the $2^N$ word lines to generate a first encoded value;
wherein the first word line fault detection circuit comprises:
N/2 bit lines;
N/2 complementary bit lines for the N/2 bit lines;
one transistor per bit line; and
one transistor per complementary bit line;
a second word line fault detection circuit associated with the second memory array, the second word line fault detection circuit configured to encode signals on the $2^N$ word lines to generate a second encoded value;
wherein the second word line fault detection circuit comprises:
N/2 bit lines;
N/2 complementary bit lines for the N/2 bit lines;
one transistor per bit line; and
one transistor per complementary bit line; and
comparison circuitry configured to compare the first encoded value to a first expected value corresponding to odd bits of the N-bit row address and to compare the second encoded value to a second expected value corresponding to even bits of the N-bit row address.

12. The circuit of claim 11, wherein the N/2 bit lines of the first word line fault detection circuit correspond to odd bits of the N-bit row address; and wherein the N/2 bit lines of the second word line fault detection circuit correspond to even bits of the N-bit row address.

13. The circuit of claim 12, wherein the first word line fault detection circuit has its transistors connected to its N/2 bit lines and N/2 complementary bit lines in a first configuration pattern in which each transistor of the first word line fault detection circuit is connected to couple one of the N/2 bit lines of the first word line fault detection circuit or one of the N/2 complementary bit lines of the first word line fault detection circuit to ground in response to assertion of an associated one of the $2^N$ word lines;
wherein the second word line fault detection circuit has its transistors connected to its N/2 bit lines and N/2 complementary bit lines in a second configuration pattern in which each transistor of the second word line fault detection circuit is connected to couple one of the N/2 bit lines of the second word line fault detection circuit or one of the N/2 complementary bit lines of the second word line fault detection circuit to ground in response to assertion of an associated one of the $2^N$ word lines; and
wherein the second configuration pattern is different than the first configuration pattern.

14. A circuit, comprising:
a first memory array;
a second memory array;
$2^N$ lines common to the first memory array and the second memory array;
a circuit configured to selectively drive the $2^N$ lines in response to an N-bit address;
a first fault detection circuit associated with the first memory array, the first fault detection circuit configured to encode signals on the $2^N$ lines to generate a first encoded value;
wherein the first word line fault detection circuit comprises:
N/2 bit lines;
N/2 complementary bit lines for the N/2 bit lines;
one transistor per bit line; and
one transistor per complementary bit line;
a second fault detection circuit associated with the second memory array, the second fault detection circuit configured to encode signals on the $2^N$ lines to generate a second encoded value;
wherein the second word line fault detection circuit comprises:
N/2 bit lines;
N/2 complementary bit lines for the N/2 bit lines;
one transistor per bit line; and
one transistor per complementary bit line; and
comparison circuitry configured to compare the first encoded value to a first expected value corresponding to odd bits of the N-bit address and to compare the second encoded value to a second expected value corresponding to even bits of the N-bit address.

15. The circuit of claim 14, wherein the N/2 bit lines of the first fault detection circuit correspond to odd bits of the N-bit address; and wherein the N/2 bit lines of the second fault detection circuit correspond to even bits of the N-bit address.

16. The circuit of claim 15, wherein the first fault detection circuit has its transistors connected to its N/2 bit lines and N/2 complementary bit lines in a first configuration pattern in which each transistor of the first fault detection circuit is connected to couple one of the N/2 bit lines of the first fault detection circuit or one of the N/2 complementary bit lines of the first fault detection circuit to ground in response to assertion of an associated one of the $2^N$ lines;
wherein the second fault detection circuit has its transistors connected to its N/2 bit lines and N/2 complementary bit lines in a second configuration pattern in which each transistor of the second fault detection circuit is connected to couple one of the N/2 bit lines of the second fault detection circuit or one of the N/2 complementary bit lines of the second fault detection circuit to ground in response to assertion of an associated one of the $2^N$ lines; and
wherein the second configuration pattern is different than the first configuration pattern.

17. A circuit, comprising:
memory arrays;
$2^N$ word lines common to the memory arrays;
a row decoder configured to drive the word lines in response to a row address, the row address being comprised of N bits;
word line fault detection circuits associated with the memory arrays, the word line fault detection circuits configured to encode signals on the word lines to generate encoded values;
wherein the word line fault detection circuits each comprise:
N/2 bit lines;
N/2 complementary bit lines for the N/2 bit lines;
at least one transistor per bit line; and
at least one transistor per complementary bit line; and
comparison circuitry configured to detect presence of a word line fault based upon the encoded values.

18. The circuit of claim 17, wherein the comparison circuitry detects the presence of the word line fault based upon comparing the encoded values to expected values.

19. The circuit of claim 17, wherein the row decoder is located between two adjacent ones of the memory arrays.

20. The circuit of claim 19, wherein the word line fault detection circuits are located adjacent to the two adjacent ones of the memory arrays on sides thereof opposite to the row decoder.

21. The circuit of claim 17, wherein the comparison circuitry comprises:
comparison circuits configured to compare the encoded values to expected values corresponding to portions of the row address, and asserts error flags based upon lack of matches between the encoded values and the expected values.

22. The circuit of claim 17, wherein the word line fault detection circuits collectively define a word line encoder configured to generate a total encoded value from signals on the word lines, the total encoded value including the each of the encoded values.

23. A method, comprising:
selectively driving a plurality of word lines common to first and second memory arrays, in response to receipt of a row address;
encoding signals on the plurality of word lines to generate a first encoded value, using a first word line fault detection circuit, by turning on a transistor within the first word line fault detection circuit associated with either a bit line or a complementary bit line within the first word line fault detection circuit;
encoding signals on the plurality of word lines to generate a second encoded value, using a second word line fault detection circuit, by turning on a transistor within the second word line fault detection circuit associated with either a bit line or a complementary bit line within the first word line fault detection circuit;
comparing the first encoded value to a first expected value corresponding to a first portion of the row address and comparing the second encoded value to a second expected value corresponding to a second portion of the row address; and
asserting at least one error flag indicating presence of a word line fault based upon a lack of match between the first encoded value and the first expected value and/or a lack of match between the second encoded value and the second expected value.

24. The method of claim 23, wherein comparing the first encoded value to the first expected value corresponding to the first portion of the row address and comparing the second encoded value to the second expected value corresponding to a second portion of the row address is performed by:
comparing the first encoded value to the first expected value corresponding to the first portion of the row address and asserting a first error flag indicating presence of a word line fault with the first memory array based upon a lack of match between the first encoded value and the first expected value, using a first comparison circuit; and
comparing the second encoded value to the second expected value corresponding to the second portion of the row address and to assert a second error flag indicating presence of a word line fault with the second memory array based upon a lack of match between the second encoded value and the second expected value, using a second comparison circuit.

25. The method of claim 23, further comprising generating a total encoded value from signals on the plurality of word lines, the total encoded value including the first encoded value and the second encoded value, using a word line encoder collectively defined by the first word line fault detection circuit and the second word line fault detection circuit.

* * * * *